US011901317B2

(12) United States Patent
Matsumaru (10) Patent No.: US 11,901,317 B2
(45) Date of Patent: Feb. 13, 2024

(54) WIRELESS MODULE (71) Applicant: FUJIKURA LTD., Tokyo (JP)

(72) Inventor: Kohei Matsumaru, Sakura (JP)

(73) Assignee: FUJIKURA LTD., Tokyo (JP)

(*) Notice: Subject to any disclaimer, the term of this patent is extended or adjusted under 35 U.S.C. 154(b) by 512 days.

(21) Appl. No.: 17/265,273

(22) PCT Filed: Dec. 17, 2020

(86) PCT No.: PCT/JP2020/047184
§ 371 (c)(1),
(2) Date: Feb. 2, 2021

(87) PCT Pub. No.: WO2021/255963
PCT Pub. Date: Dec. 23, 2021

(65) Prior Publication Data
US 2022/0189891 A1    Jun. 16, 2022

(30) Foreign Application Priority Data

Jun. 17, 2020 (JP) ................................ 2020-104539

(51) Int. Cl.
*H01L 23/66* (2006.01)
*H01L 23/12* (2006.01)
*H01P 3/08* (2006.01)

(52) U.S. Cl.
CPC ............. *H01L 23/66* (2013.01); *H01L 23/12* (2013.01); *H01P 3/082* (2013.01); *H01L 2223/6677* (2013.01); *H01L 2223/6683* (2013.01)

(58) Field of Classification Search
CPC ........ H05K 1/141; H05K 1/144; H05K 1/183; H05K 2201/09618; H05K 2201/10371
See application file for complete search history.

(56) References Cited

U.S. PATENT DOCUMENTS

2002/0049042 A1* 4/2002 Oida .................. H01Q 23/00
257/E23.114
2008/0157295 A1* 7/2008 Nuytkens ............... H05K 1/144
257/E21.705
(Continued)

FOREIGN PATENT DOCUMENTS

CN       108886379 A    11/2018
JP       2002-222912 A   8/2002
(Continued)

OTHER PUBLICATIONS

Communication in cases for which no other form is applicable (Form PCT/IB/345) issued in counterpart International Application No. PCT/JP2020/047184 dated Apr. 19, 2021, with Form PCT/ISA/237(English Translation of the written opinion) and PCT/IB/310(Notification concerning documents transmitted). (8 pages) Japanese version was submitted with the Apr. 20, 2021 IDS.

(Continued)

*Primary Examiner* — Erik Kielin
(74) *Attorney, Agent, or Firm* — WHDA, LLP (57) ABSTRACT

The present invention reduces an electromagnetic coupling that can occur between a first signal line provided on a first substrate and a second signal line provided on a main surface of a second substrate on the first substrate side. A wireless module (10) includes an RFIC (28), a baseband IC (16), a first substrate (11) on which first signal lines (121 through 126) for transmitting a baseband signal are provided, and a second substrate (21) provided with second signal lines (2201 through 2232) for transmitting an RF signal on a main surface (211). The first substrate (11) is provided with a pseudo conductor wall (post wall 13) for shielding the first signal lines (121 through 126) and the second signal lines (2201 through 2232).

5 Claims, 3 Drawing Sheets

(56) References Cited

U.S. PATENT DOCUMENTS

| | | | | |
|---|---|---|---|---|
| 2008/0297283 | A1* | 12/2008 | Byun | ............... H01P 5/107 333/21 R |
| 2013/0194754 | A1* | 8/2013 | Jung | ............... H05K 1/0216 361/720 |
| 2020/0344869 | A1* | 10/2020 | So | ............... H01L 23/5383 |
| 2021/0234256 | A1* | 7/2021 | Landesberger | .... H01Q 15/0006 |

FOREIGN PATENT DOCUMENTS

| | | |
|---|---|---|
| JP | 2005/311337 A | 11/2005 |
| JP | 2006-066612 A | 3/2006 |
| JP | 2008-131166 A | 6/2008 |
| JP | 2011-155287 A | 8/2011 |
| JP | 2020-088366 A | 6/2020 |
| WO | 2016/056387 A1 | 4/2016 |
| WO | 2019066870 A1 | 4/2019 |

OTHER PUBLICATIONS

International search report dated Mar. 9, 2021, issued in counterpart Application No. PCT/JP2020/047184. (3 pages).
Written opinion dated Mar. 9, 2021, issued in counterpart Application No. PCT/JP2020/047184. (3 pages).

* cited by examiner

WIRELESS MODULE

TECHNICAL FIELD

The present invention relates to a wireless module which can be used in a millimeter-wave band.

BACKGROUND ART

FIG. 1 of Patent Literature 1 shows a high-frequency multichip module which includes two ceramic substrates and a multilayer glass epoxy substrate. Each of the ceramic substrates is provided with two bare chip ICs on one surface thereof. The multilayer glass epoxy substrate has a plurality of metal layers and two through holes. The two ceramic substrates are mounted on one surface of the multilayer glass epoxy substrate such that the two bare chip ICs mounted on each of the two ceramic substrates face the corresponding through-hole. In other words, the two ceramic substrates are mounted on one surface of the multilayer glass epoxy substrate such that, in a plan view, the two bare chip ICs are encompassed by the corresponding one of the two through holes.

Note that the bare chip IC, the ceramic substrate, the multilayer glass epoxy substrate, and the high-frequency multichip module are read as an RFIC, a second substrate, a first substrate, and the wireless module in accordance with an aspect of the present invention, respectively. Moreover, the through hole is read as a through-hole or a non-through-hole in accordance with an aspect of the present invention. In addition, a part of the plurality of metal layers is read as one or more first signal lines in accordance with an aspect of the present invention. In the following descriptions, the names of members of the invention disclosed in FIG. 1 of Patent Literature 1 are read as the name of members in an aspect of the present invention.

CITATION LIST

Patent Literature

[Patent Literature 1]
Japanese Patent Application Publication Tokukaihei No. 2002-222912

SUMMARY OF INVENTION

Technical Problem

The wireless module as described above may be configured as follows. That is, a baseband IC that processes a baseband signal is mounted on one main surface of a first substrate. Further, a second substrate is provided with a second signal line for transmitting an RF signal, which is a millimeter-wave signal supplied from an RFIC, and with an antenna element supplied with electric power through the second signal line. In this configuration, the baseband signal processed by the baseband IC is transmitted through the first signal line. The wireless module thus configured can transmit, or receive, or transmit and receive the RF signal.

In order to reduce a transmission loss in such a wireless module, it is preferable that the second signal line is not provided in an inner layer of the second substrate but is provided on one of two main surfaces of the second substrate. More preferably, the second signal line is provided on a main surface of the second substrate on a first substrate side. This is because the RF signal emitted from the antenna element is radiated to the space through another main surface of the second substrate, said another main surface not facing the first substrate.

In the wireless module having the more preferable configuration, the second signal line is provided on the main surface of the second substrate on the first substrate side, and this can result in an electromagnetic coupling between the first signal line and the second signal line. This can further cause interference between the baseband signal and the RF signal and, due to this, there is a possibility that at least one of the baseband signal and the RF signal is deteriorated.

An aspect of the present invention is accomplished in view of the above described problems, and its object is to reduce an electromagnetic coupling that can occur between the first signal line and the second signal line in the wireless module including (i) the first substrate provided with the first signal line and (ii) the second substrate which is mounted on a first main surface of the first substrate and is provided with the second signal line on a main surface on the first main surface side.

Solution to Problem

In order to solve the problems, a wireless module in accordance with a first aspect of the present invention employs a configuration including: an RFIC which processes an RF signal; a baseband IC which processes a baseband signal; a first substrate which is provided with the baseband IC on at least one main surface, the first substrate being provided with one or more first signal lines for transmitting the baseband signal; a second substrate which is mounted on one main surface side of the first substrate, the RFIC being mounted on a main surface of the second substrate on a first substrate side, and one or more second signal lines for transmitting the RF signal being provided on the main surface on the first substrate side; and one or more antenna elements which are provided on the second substrate and are supplied with electric power through the one or more second signal lines, in which the first substrate is provided with at least one of a conductor wall and a pseudo conductor wall for shielding the one or more first signal lines and the one or more second signal lines.

Advantageous Effects of Invention

According to an aspect of the present invention, it is possible to reduce an electromagnetic coupling that can occur between the first signal line and the second signal line in the wireless module including (i) the first substrate provided with the first signal line and (ii) the second substrate which is mounted on a first main surface of the first substrate and is provided with the second signal line on a main surface on the first main surface side.

BRIEF DESCRIPTION OF DRAWINGS

Each of (a) and (b) of FIG. 2 is a plan view illustrating a first substrate and a second substrate included in the wireless module illustrated in FIG. 1. (a) of FIG. 2 is a top view (seen from above in FIG. 1), and (b) of FIG. 2 is a bottom view (seen from below in FIG. 1).

(a) through (c) of FIG. 3 are cross-sectional views illustrating the wireless module illustrated in FIG. 1, a first modification example of the wireless module, and a second modification example of the wireless module, respectively.

DESCRIPTION OF EMBODIMENTS

[Wireless Module]

A wireless module in accordance with an aspect of the present invention is designed to transmit, or receive, or transmit and receive an RF signal in which a signal is superimposed on an electromagnetic wave belonging to a millimeter-wave band. A frequency of the RF signal is not limited to a particular one, provided that the frequency belongs to the millimeter-wave band. Hereinafter, a frequency of 60 GHz is employed as an example.

A wireless module 10, which is an embodiment of such a wireless module, will be described with reference to FIG. 1, FIG. 2, and (a) of FIG. 3. Furthermore, a wireless module 10A, which is a first modification example of the wireless module 10, will be described with reference to (b) of FIG. 3, and a wireless module 10B, which is a second modification example of the wireless module 10, will be described with reference to (c) of FIG. 3.

Figure 1:
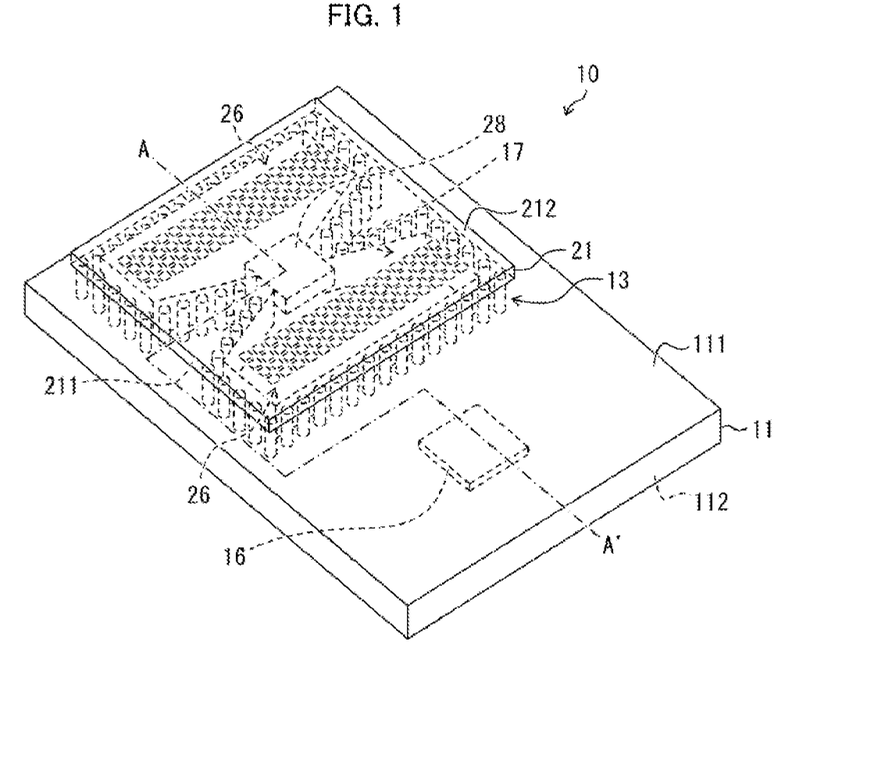
FIG. 1 is a perspective view illustrating a wireless module in accordance with an embodiment of the present invention.

FIG. 1 is a perspective view illustrating the wireless module 10. Each of (a) and (b) of FIG. 2 is a plan view illustrating a first substrate 11 and a second substrate 21 included in the wireless module 10. (a) of FIG. 2 is a top view (seen from above in FIG. 1), and (b) of FIG. 2 is a bottom view (seen from below in FIG. 1). (a) through (c) of FIG. 3 are cross-sectional views which are taken along the line A-A' in FIG. 1 and illustrate the wireless module 10, the wireless module 10A, and the wireless module 10B, respectively. Note that the line A-A' is based on a straight line passing through a baseband IC 16 and an RFIC 28, and is defined so that a part of the line A-A' passes through an outside of a through-hole 17 along a first signal line 124 illustrated in (a) of FIG. 2.

<Overview of Wireless Module Configuration>

As illustrated in FIG. 1, the wireless module 10 includes a first substrate 11, a second substrate 21, a post wall 13, a baseband IC 16, and an RFIC 28.

The first substrate 11 is a multilayer substrate configured by stacking and bonding a plurality of substrates, each of which is made of a dielectric substance. A specific stacking structure of the first substrate 11 will be described later with reference to FIG. 3. One main surface of the first substrate 11 (the main surface on the upper side in FIG. 1) is referred to as "main surface 111", and the other main surface of the first substrate 11 (the main surface on the lower side in FIG. 1) is referred to as "main surface 112".

In a plan view of the main surface 111, a region that encompasses the RFIC 28, an antenna element group 26, and a second signal line group (not illustrated in FIG. 1) is referred to as "second signal line region". The first substrate 11 has a through-hole 17 which is provided in a region facing the second signal line region. These arrangements will be described later with reference to FIG. 2.

The post wall 13 is provided in the first substrate 11 along a whole of a side wall of the through-hole 17 so as to surround the through-hole 17. The post wall 13 is configured by arranging a plurality of conductor posts at predetermined intervals so as to constitute a fence-like structure.

The second substrate 21 is a multilayer substrate configured by stacking and bonding a plurality of substrates, each of which is made of a dielectric substance. A specific stacking structure of the second substrate 21 will be described later with reference to FIG. 3. The second substrate 21 is mounted so as to face the main surface 111 of the first substrate 11. One main surface (i.e., a main surface on the lower side in FIG. 1) of the second substrate 21 on a first substrate 11 side is referred to as "main surface 211", and the other main surface (i.e., a main surface on the upper side in FIG. 1) of the second substrate 21 on a side opposite to the first substrate 11 is referred to as "main surface 212".

The main surface 112 of the first substrate 11 is provided with the baseband IC 16 which processes a baseband signal. Moreover, the main surface 211 of the second substrate 21 is provided with the RFIC 28 which processes an RF signal.

A first signal line group 12 is provided in an inner layer of the first substrate 11. The first signal line group 12 is provided for transmission of the baseband signal between the baseband IC 16 and the RFIC 28, specifically, for transmission of the baseband signal in the first substrate 11. A second signal line group 22 is provided on the main surface 211 of the second substrate 21. The second signal line group 22 is provided for transmission of the RF signal between the RFIC 28 and the antenna element group 26. A third signal line group 25 is provided in an inner layer of the second substrate 21. The third signal line group 25 is provided for transmission of the baseband signal between the baseband IC 16 and the RFIC 28, specifically, for transmission of the baseband signal in the second substrate 21. These arrangements will be described later with reference to FIG. 2.

The wireless module 10 thus configured can transmit, or receive, or transmit and receive the RF signal as above described.

In a case where the wireless module 10 transmits an RF signal, the RFIC 28 obtains a baseband signal processed by the baseband IC 16, and the RFIC 28 carries out a process of converting the baseband signal into an RF signal. The RF signal is then emitted from the antenna element group 26.

In a case where the wireless module 10 receives an RF signal, the RFIC 28 obtains the RF signal which has been received through the antenna element group 26. Further, the RFIC 28 carries out a process of converting the RF signal into a baseband signal. The baseband signal is then supplied to the baseband IC 16.

Note that, in a case where the wireless module 10 transmits and receives an RF signal, the wireless module 10 can be configured so as to be capable of carrying out both the transmission process and the reception process which are described above.

<First Substrate>

Figure 2:
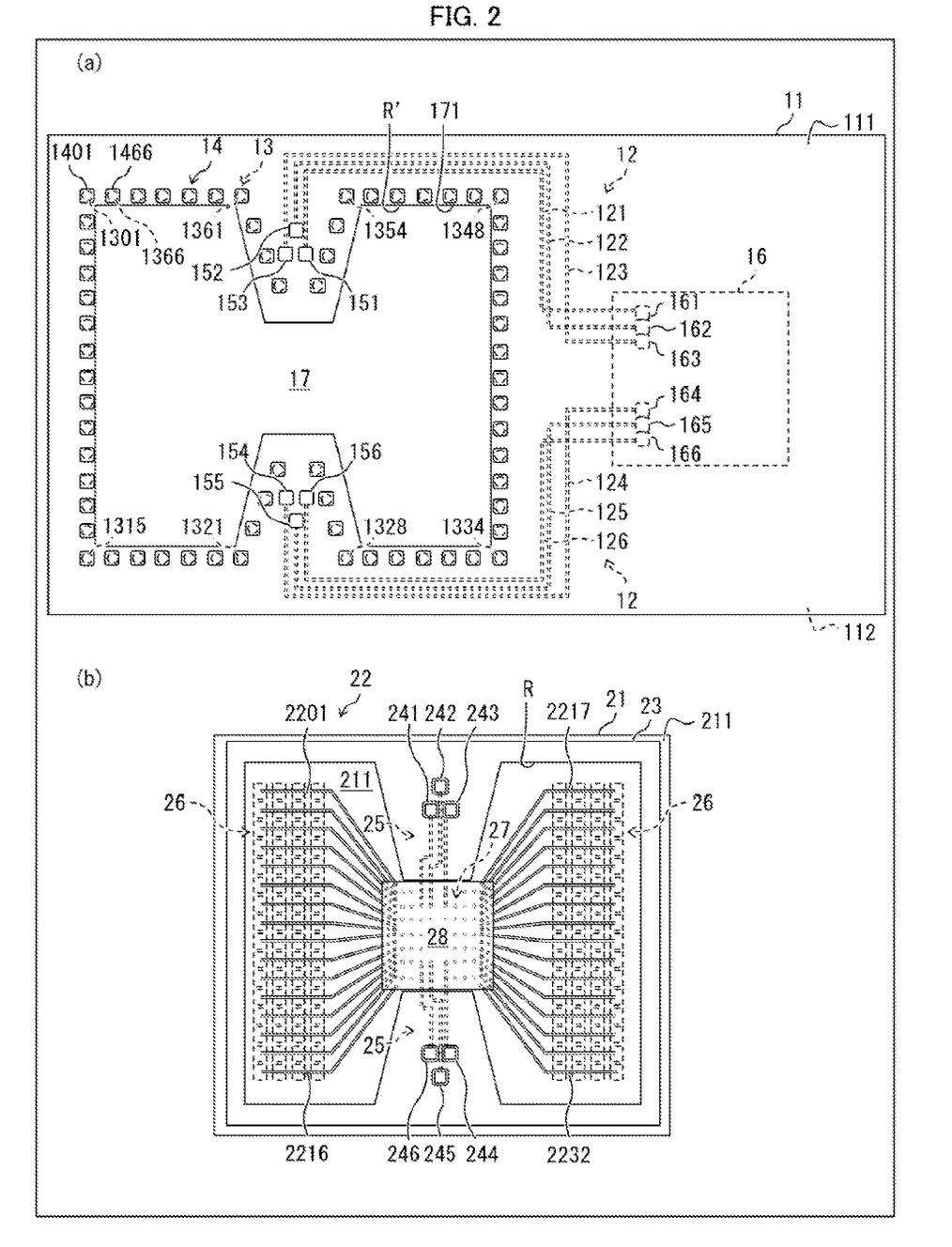

As illustrated in (a) of FIG. 2, the first substrate 11, in a plan view, has a rectangular shape composed of a pair of longer sides and a pair of shorter sides. In the first substrate 11, the baseband IC 16 is mounted on a side near to one shorter side (the right shorter side in (a) of FIG. 2). Further, the second substrate 21 is mounted on a side near to the other shorter side (the left shorter side in (a) of FIG. 2). The second substrate 21 will be described later with reference to (b) of FIG. 2.

Figure 3:
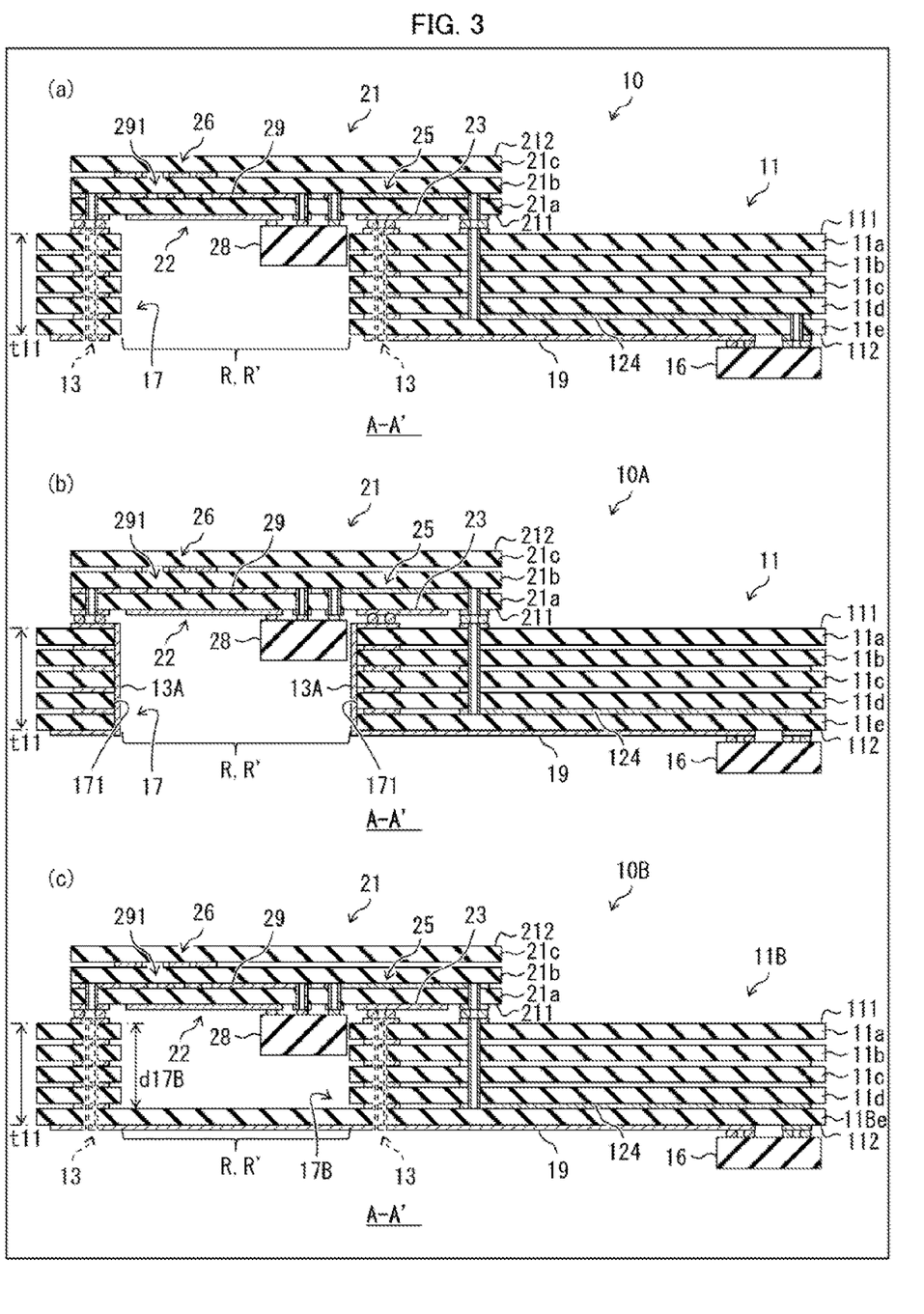

As illustrated in (a) of FIG. 3, i.e., in the cross-sectional view, the first substrate 11 is configured by stacking and bonding five substrates, i.e., substrates 11a through 11e. Each of the substrates 11a through 11e is made of a dielectric substance. As such, the first substrate 11 includes a pair of outer layers, i.e., the main surfaces 111 and 112, and four inner layers interposed between adjacent ones of the substrates 11a through 11e.

In the present embodiment, a glass epoxy resin having a specific inductive capacity $\varepsilon$ of 4.6 is employed as the dielectric substance constituting the substrates 11a through 11e. The glass epoxy resin is an example of glass fiber reinforced plastic (GFRP). A standard name of a substrate using such a glass epoxy resin can be, for example, FR-4. In other words, in the present embodiment, a plate material in conformity to FR-4 (hereinafter referred to as "FR4 material") is employed as each of the substrates 11a through 11e. Each of the substrates 11a through 11e has a thickness of 120 μm. Therefore, a thickness t11 of the first substrate 11 (see (a) of FIG. 3) is 600 μm (where a thickness of the inner layer is ignored).

Note, however, that the thickness, the number of pieces, and the like of the plurality of substrates which are made of the dielectric substance and constitute the first substrate 11 are not limited to the configuration described above, and can be selected as appropriate.

The dielectric substance constituting the substrates 11a through 11e is not limited to the glass epoxy resin described above. The dielectric substance constituting the substrates 11a through 11e can be appropriately selected while considering physical properties such as a specific inductive capacity and a dielectric loss tangent. Other examples of the dielectric substance that constitutes the substrates 11a through 11e include a liquid crystal polymer (LCP) resin, an acrylic resin, glass, and the like. Note, however, that, by employing the glass epoxy resin as the dielectric substance constituting the substrates 11a through 11e, it is possible to reduce a manufacturing cost of the first substrate 11.

(Conductor Pad)

The main surface 112 of the first substrate 11 is provided with conductor pads 161 through 166 to which terminals of the baseband IC 16 are connected (see (a) of FIG. 2). The main surface 112 is provided with a ground layer 19 constituted by a conductor film (see (a) of FIG. 3). The terminals of the baseband IC 16 are connected to the conductor pads 161 through 166 and the ground layer 19 with use of, for example, solder balls, and the baseband IC 16 is thus mounted on the main surface 112 side of the first substrate 11.

(First Signal Line Group)

The inner layer of the first substrate 11 includes the first signal line group 12 arranged in a pattern as illustrated in (a) of FIG. 2. The first signal line group 12 is made up of six first signal lines, i.e., first signal lines 121 through 126. One ends of the first signal lines 121 through 126 are connected to the respective conductor pads 161 through 166 through respective vias. The first signal line group 12 and the ground layer 19 constitute a microstrip line for transmitting a baseband signal.

As illustrated in (a) of FIG. 3, the first signal line 124 is provided in the inner layer interposed between the substrate 11d and the substrate 11e. Each of the first signal lines 121 through 123, 125, and 126 is provided in one of the four inner layers. Note, however, that the configuration of the first signal lines is not limited to the above described configuration. Each of the first signal lines may span two or more layers.

(Conductor Pad)

As illustrated in (a) of FIG. 2, the main surface 111 is provided with conductor pads 151 through 156 to which terminals of the RFIC 28 are connected. The conductor pads 151 through 156 are connected to the respective first signal lines 121 through 126 through respective vias.

(Through-Hole)

In the plan view, the first substrate 11 has the through-hole 17 which is formed in a region R' inside a region where the second substrate 21 is provided (see (a) of FIG. 2). The region R' is based on a rectangular shape whose aspect ratio is close to 1:1, and has a pattern in which portions of opposite sides (i.e., the upper side and the lower side in (a) of FIG. 2) in the vicinity of the center approach each other so that the region R' is narrowed in that part. In the present embodiment, a pattern like the alphabetic letter "H" is employed as the pattern of the region R'. Note that the conductor pads 151 through 156 are provided in regions corresponding to the narrowed portions of the region R'.

Note, however, that the region R' is not limited to the above described pattern, provided that the pattern corresponds to the second signal line region R described with reference to (b) of FIG. 2.

(Conductor Post)

The post wall 13 is provided in the first substrate 11 along a whole of a side wall 171 of the through-hole 17 so as to surround the through-hole 17. The post wall 13 is configured by arranging 66 conductor posts, i.e., conductor posts 1301 through 1366 at predetermined intervals so as to constitute a fence-like structure. The post wall 13 reflects an electromagnetic wave having an intended frequency (i.e., 60 GHz in the present embodiment). This is achieved by appropriately designing diameters of the respective conductor posts 1301 through 1366 and the center-to-center spacing between adjacent two conductor posts. That is, the post wall 13 is an aspect of the pseudo conductor wall.

The post wall 13 is arranged so as to shield (i) first signal lines 121 through 126 constituting the first signal line group 12 and (ii) second signal lines 2201 through 2232 constituting the second signal line group 22 described later. In the present embodiment, the post wall 13 is arranged along the whole of the side wall 171 of the through-hole 17.

Note, however, that the post wall 13 can be provided along at least part of the side wall 171 of the through-hole 17. For example, the post wall 13 can shield the first signal line group 12 and the second signal line group 22 even in a case where the conductor posts 1301 through 1315 are omitted from the conductor posts 1301 through 1366 constituting the post wall 13. Such a configuration is also included in the scope of the present invention.

(Ground Pad)

In the main surface 111, ground pads 1401 through 1466 are provided at respective positions of the conductor posts 1301 through 1366 so as to encompass the respective conductor posts 1301 through 1366. The ground pads 1401 through 1466 are collectively referred to as "ground pad group 14". The ground pads 1401 through 1466 are conductive pads and are shorted to the ground layer 19 via the conductor posts 1301 through 1366. To the ground pads 1401 through 1466, a ground pattern 23 (described later) of the second substrate 21 illustrated in (b) of FIG. 2 and (a) of FIG. 3 is connected by using, for example, solder balls.

<Second Substrate>

As illustrated in (b) of FIG. 2, in the plan view, the second substrate 21 has a rectangular shape composed of a pair of longer sides and a pair of shorter sides. Note, however, that the aspect ratio is closer to 1:1 as compared with the first substrate 11, that is, the second substrate 21 has a rectangular shape close to a square shape. In the second substrate 21 illustrated in (b) of FIG. 2, a pair of opposite sides extending along the left-right direction is a pair of longer sides, and a pair of opposite sides extending along the up-down direction is a pair of shorter sides. A length of the pair of shorter sides of the second substrate 21 is shorter than (specifically, approximately 80 percent of) that of the pair of shorter sides of the first substrate 11. A length of the pair of longer sides of the second substrate 21 is shorter than (specifically, approximately half of) that of the pair of longer sides of the first substrate 11.

As illustrated in (a) of FIG. 3, i.e., in the cross-sectional view, the second substrate 21 is configured by stacking and bonding three substrates, i.e., substrates 21a through 21c. Each of the substrates 21a through 21c is made of a dielectric substance. As such, the second substrate 21 includes a pair of outer layers, i.e., the main surfaces 211 and 212, and two inner layers interposed between adjacent ones of the substrates 21a through 21c.

In the present embodiment, a liquid crystal polymer (LCP) resin is employed as the dielectric substance constituting the substrates 21a through 21c. Each of the substrates 21a through 21c has a thickness of 50 μm to 100 μm.

Note, however, that the thickness, the number of pieces, and the like of the plurality of substrates which are made of the dielectric substance and constitute the second substrate 21 are not limited to the configuration described above, and can be selected as appropriate.

The dielectric substance constituting the substrates 21a through 21c is not limited to the LCP resin described above. The dielectric substance constituting the substrates 21a through 21c can be appropriately selected while considering physical properties such as a specific inductive capacity and a dielectric loss tangent. Other examples of the dielectric substance that constitutes the substrates 21a through 21c include a glass fiber reinforced plastic (GFRP) resin, an acrylic resin, glass, and the like. Further, an example of the GFRP resin includes a glass epoxy resin, and a standard name of a substrate using such a glass epoxy resin can be, for example, FR-4. Note, however, that, by employing the LCP resin as the dielectric substance constituting the substrates 21a through 21c, it is possible to reduce a transmission loss of an RF signal in the second signal line group 22 (described later).

(Conductor Pad)

As illustrated in (b) of FIG. 2, a center region of the main surface 211 of the second substrate 21 is provided with a conductor pad group 27 consisted by a plurality of conductor pads. The plurality of conductor pads are arranged in a lattice pattern. To the plurality of conductor pads, one ends of the plurality of second signal lines constituting the second signal line group 22 (described later), one ends of the plurality of third signal lines constituting the third signal line group 25 (described later), and a ground layer 29 illustrated in (a) of FIG. 3 are connected. The terminals of the RFIC 28 are connected to the plurality of conductor pads with use of, for example, solder balls, and the RFIC 28 is thus mounted on the main surface 211 side of the second substrate 21.

(Second Signal Line Group)

On the main surface 211, the second signal line group 22 is provided in a pattern as illustrated in (b) of FIG. 2. The second signal line group 22 is made up of 32 second signal lines, i.e., second signal lines 2201 through 2232. One ends of the second signal lines 2201 through 2232 are connected to the respective plurality of conductor pads described above. Note that, in (b) of FIG. 2, only the reference numerals 2201, 2216, 2217, and 2232 are indicated among the second signal lines 2201 through 2232, and the other reference numerals of the second signal lines are omitted.

(Ground Pattern)

In the main surface 211, a region encompassing the second signal line group 22 and the plurality of conductor pads described above is referred to as "region R", and a ground pattern 23 surrounding the region R is provided on the outer side of the region R. In the wireless module 10, the region R in the second substrate 21 and the region R' in the first substrate 11 face each other. In the plan view of the wireless module 10, the ground pattern 23 is provided in a region encompassing the post wall 13 and the ground pad group 14. The ground pattern 23 is connected to the ground pads 1401 through 1466 constituting the ground pad group 14 via, for example, solder balls. The third signal line group 25 (described later) and the ground pattern 23 constitute a microstrip line for transmitting a baseband signal.

(Conductor pad)

As illustrated in (b) of FIG. 2, the main surface 211 is provided with conductor pads 241 through 246 to which the conductor pads 151 through 156 provided on the main surface 111 are connected. The conductor pads 241 through 246 are connected to the conductor pads 151 through 156 via solder balls, respectively.

As such, the ground pattern 23 is connected to the ground pad group 14, and the conductor pads 241 through 246 are connected to the conductor pads 151 through 156, respectively. Thus, the second substrate 21 is mounted on the main surface 111 side of the first substrate 11.

(Third Signal Line Group)

The inner layer of the second substrate 21 includes the third signal line group 25 arranged in a pattern as illustrated in (b) of FIG. 2. The third signal line group 25 is made up of six third signal lines. In (b) of FIG. 2, reference numerals are not given to the six third signal lines. One ends of the six third signal lines are connected, through vias, to any ones of the plurality of conductor pads provided in a region in which the RFIC 28 is mounted. The other ends of the six third signal lines are connected to the respective conductor pads 241 through 246 through respective vias. Baseband signals obtained from the first signal line group 12 are supplied to the RFIC 28 through the third signal line group 25.

As illustrated in (a) of FIG. 3, the third signal line group 25 is provided in an inner layer interposed between the substrate 21a and the substrate 21b. Note, however, that the position at which the third signal line group 25 is provided is not limited to the inner layer interposed between the substrate 21a and the substrate 21b. The third signal line group 25 can be provided in an inner layer interposed between the substrate 21b and the substrate 21c.

(Ground Layer)

The ground layer 29 is provided in the inner layer interposed between the substrate 21a and the substrate 21b among the inner layers in the second substrate 21 (see (a) of FIG. 3). The second signal line group 22 and the ground layer 29 constitute a microstrip line for transmitting an RF signal.

(Antenna Element Group)

The inner layer of the second substrate 21 includes the antenna element group 26 arranged in a pattern as illustrated in (b) of FIG. 2. The antenna element group 26 is constituted by two sets of 64 antenna elements arranged in a matrix of 16 rows and 4 columns.

In the present embodiment, as illustrated in (b) of FIG. 2 and (a) of FIG. 3, four antenna elements arranged in the same row in one set of the antenna elements are supplied with electric power through one of the second signal lines 2201 through 2232.

The ground layer 29 is provided with a coupling window group 291 constituted by 128 coupling windows. The coupling windows are provided in respective regions corresponding to centers of the respective 128 antenna elements constituting the antenna element group 26 in a plan view of the ground layer 29. (a) of FIG. 3 illustrates four coupling windows of the coupling windows constituting the coupling window group 291. The second signal lines 2201 through 2232 are electromagnetically coupled to the respective 128 antenna elements constituting the antenna element group 26 via the respective 128 coupling windows provided in the ground layer 29. Note that the 128 coupling windows correspond to the 128 antenna elements, respectively. In the plan view, the 128 coupling windows are provided in respective regions in which the second signal lines 2201 through 2232 are overlapped on the respective 128 antenna elements constituting the antenna element group 26.

As illustrated in (a) of FIG. 3, the antenna element group 26 is provided in an inner layer interposed between the substrate 21*b* and the substrate 21*c*. Note, however, that the position at which the antenna element group 26 is provided is not limited to the inner layer interposed between the substrate 21*b* and the substrate 21*c*. The antenna element group 26 can be provided on the main surface 212 of the second substrate 21.

<First Modification Example>

The following description will discuss a wireless module 10A, which is a first modification example of the wireless module 10, with reference to (b) of FIG. 3.

The wireless module 10A is obtained by replacing the post wall 13 provided in the wireless module 10 with a conductor wall 13A. That is, a configuration of the wireless module 10A other than the conductor wall 13A is the same as that of the wireless module 10. Therefore, in the present modification example, only the conductor wall 13A will be described, and descriptions of other configurations will be omitted.

As illustrated in (b) of FIG. 3, the conductor wall 13A is a conductor film provided in the side wall 171 of the through-hole 17. In this modification example, the conductor wall 13A is provided along a whole of the side wall 171 of the through-hole 17. Note, however, that the conductor wall 13A can be provided along a part of the side wall 171 of the through-hole 17. This point is the same as the post wall 13.

The conductor wall 13A thus configured shields the first signal lines 121 through 126 and the second signal lines 2201 through 2232.

In a modification example of the present invention, both of the post wall 13 and the conductor wall 13A can be provided.

<Second Modification Example>

The following description will discuss a wireless module 10B, which is a second modification example of the wireless module 10, with reference to (c) of FIG. 3.

The wireless module 10B is obtained by replacing the first substrate 11 provided in the wireless module 10 with a first substrate 11B. That is, a configuration of the wireless module 10B other than the first substrate 11B is the same as that of the wireless module 10. Therefore, in the present modification example, only the first substrate 11B will be described, and descriptions of other configurations will be omitted.

As illustrated in (c) of FIG. 3, the first substrate 11B is configured by stacking and bonding five substrates, i.e., substrates 11*a*, 11*b*, 11*c*, 11*d*, and 11Be. The substrates 11*a* through 11*d* included in the first substrate 11B are the same as the substrates 11*a* through 11*d* included in the first substrate 11. Meanwhile, in the substrate 11Be, the through-hole, which is provided in the region R' of the substrate 11*e* included in the first substrate 11, is omitted.

Consequently, in the region R' of the first substrate 11B, a non-through-hole 17B is provided in place of the through-hole 17. In this modification example, a depth d17B of the non-through-hole 17B is 480 μm.

Further, in the wireless module 10B, it is possible to employ the conductor wall 13A instead of the post wall 13, and it is also possible to employ both of the post wall 13 and the conductor wall 13A. In a case where the conductor wall 13A is employed, the conductor wall 13A can be provided on at least part of a main surface of the substrate 11Be on a substrate 11*d* side, as well as on at least part of a side wall of the non-through-hole 17B.

Aspects of the present invention can also be expressed as follows:

As described above, each of the wireless modules 10, 10A, and 10B includes the RFIC 28, the baseband IC 16, the first substrate 11, the first signal line group 12, and one or more antenna elements. The first substrate 11 is provided with at least one of the conductor wall 13A and the post wall 13 which is a pseudo conductor wall.

The RFIC 28 processes an RF signal, which is a millimeter-wave signal. The baseband IC 16 processes a baseband signal. The one or more antenna elements are the antenna element group 26, which is constituted by the plurality of antenna elements in the embodiment described above. The antenna element group 26 is provided in at least any of the inner layer of the second substrate 21 and the main surface 212, and is supplied with electric power through the second signal lines 2201 through 2232.

The baseband IC 16 is mounted on at least one main surface (i.e., the main surface 112 in the embodiment described above) of the first substrate 11. The first substrate 11 is provided with the first signal lines 121 through 126 for transmitting the baseband signal.

The second substrate 21 is mounted on the main surface 111 side of the first substrate 11. The main surface 211, which is the main surface of the second substrate on the main surface 111 side, is provided with the RFIC 28. In addition, the main surface 211 is provided with the second signal lines 2201 through 2232 for transmitting the RF signal, which is a millimeter-wave signal to be processed by the RFIC 28.

The conductor wall 13A is constituted by a conductor film. The post wall 13 is configured by arranging the conductor posts 1301 through 1366 so as to constitute a fence-like structure. The conductor wall 13A and the post wall 13 are arranged so as to shield the first signal lines 121 through 126 and the second signal lines 2201 through 2232.

In the main surface 211 of the second substrate 21, the region encompassing the second signal lines 2201 through 2232 is referred to as the second signal line region R. The region of the main surface 111 of the first substrate 11, which region faces the second signal line region R, is provided with the through-hole 17 or the non-through-hole 17B corresponding to the second signal line region R.

Thus, the surface of the second signal line group 22 on the first substrate 11 side is to be in contact with the air, and this makes it possible to reduce a transmission loss (dielectric loss). Further, the RFIC 28 is accommodated in the through-hole 17 or the non-through-hole 17B, and this makes it possible to achieve downsizing (or profile reduction) of the wireless module.

At least one of the conductor wall 13A and the post wall 13 is preferably provided along at least part of the side wall of the through-hole 17 or of the non-through-hole 17B.

More preferably, at least one of the conductor wall 13A and the post wall 13 is provided along the whole of the side wall of the through-hole 17 or of the non-through-hole 17B.

In a case where the through-hole 17 is employed as in the wireless module 10, a thickness t11 of the first substrate 11 is preferably equal to or greater than a quarter wavelength of an effective wavelength of the RF signal in the air. In the present embodiment, a frequency of the RF signal is 60 GHz. In this case, the quarter wavelength of the effective wavelength of the RF signal in the air is 1.25 mm. Therefore, in the present embodiment, the thickness t11 is preferably 1.25 mm or more.

In a case where the non-through-hole 17B is employed as in the wireless module 10B, each of the thickness t11 and the depth d17B of the non-through-hole 17B is preferably equal to or greater than the above quarter wavelength.

The RFIC 28 is provided in the second signal line region R of the second substrate 21.

It is preferable to further provide the baseband IC 16 which (i) is mounted on at least one of the main surface 111 and the main surface 112 of the first substrate 11 and (ii) supplies a baseband signal to the first signal lines 121 through 126 and/or is supplied with a baseband signal through the first signal lines 121 through 126.

The conductor wall 13A and the post wall 13 are shorted to the ground layer 19 which constitutes the signal line path (i.e., the microstrip line in the present embodiment) together with the first signal lines 121 through 126.

Note that, in the present embodiment, the first signal lines 121 through 126 and the second signal lines 2201 through 2232 are employed. Note, however, that each of the wireless modules 10, 10A, and 10B can include a single first signal line and a single second signal line. Moreover, in the present embodiment, the antenna element group 26 constituted by the plurality of antenna elements is employed. Note, however, that each of the wireless modules 10, 10A, and 10B can include a single antenna element.

In the present embodiment, microstrip lines are employed as the signal line path including the first signal line group 12, the signal line path including the second signal line group 22, and the signal line path including the third signal line group 25, respectively. Note, however, that the signal line path including the first signal line group 12, the signal line path including the second signal line group 22, and the signal line path including the third signal line group 25 can be coplanar lines, respectively.

Furthermore, aspects of the present invention can also be expressed as follows:

In order to solve the problems, a wireless module in accordance with a first aspect of the present invention employs a configuration including: an RFIC which processes an RF signal; a baseband IC which processes a baseband signal; a first substrate which is provided with the baseband IC on at least one main surface, the first substrate being provided with one or more first signal lines for transmitting the baseband signal; a second substrate which is mounted on one main surface side of the first substrate, the RFIC being mounted on a main surface of the second substrate on a first substrate side, and one or more second signal lines for transmitting the RF signal being provided on the main surface on the first substrate side; and one or more antenna elements which are provided on the second substrate and are supplied with electric power through the one or more second signal lines, in which the first substrate is provided with at least one of a conductor wall and a pseudo conductor wall for shielding the one or more first signal lines and the one or more second signal lines.

According to the configuration, at least one of the conductor wall and the pseudo conductor wall is provided in the first substrate so as to shield the one or more first signal lines and the one or more second signal lines, and this makes it possible to reduce an electromagnetic coupling that can occur between the first signal line and the second signal line.

Moreover, the wireless module in accordance with a second aspect of the present invention includes, in addition to the configuration of the wireless module in accordance with the above described first aspect, a configuration in which: the main surface of the second substrate on the first substrate side has a second signal line region which encompasses the one or more second signal lines; a through-hole or non-through-hole corresponding to the second signal line region being provided in a region of the one main surface of the first substrate, the region facing the second signal line region; and at least one of the conductor wall and the pseudo conductor wall is provided along at least part of a side wall of the through-hole or non-through-hole.

According to the configuration, in a case where the through-hole or non-through-hole corresponding to the second signal line region is provided in the region which is of the one main surface of the first substrate and faces the second signal line region, the surface of the one or more second signal lines on the first substrate side is to be in contact with the air, and this makes it possible to reduce a transmission loss (dielectric loss). Further, the RFIC is accommodated in the through-hole or non-through-hole, and this makes it possible to achieve downsizing (or profile reduction) of the wireless module.

The wireless module in accordance with a third aspect of the present invention includes, in addition to the configuration of the wireless module in accordance with the above described second aspect, a configuration in which: at least one of the conductor wall and the pseudo conductor wall is provided along a whole of the side wall of the through-hole or non-through-hole.

According to the configuration, in a case where the through-hole or non-through-hole corresponding to the second signal line region is provided in the region which is of the one main surface of the first substrate and faces the second signal line region, it is possible to surely reduce an electromagnetic coupling that can occur between the first signal line and the second signal line.

The wireless module in accordance with a fourth aspect of the present invention includes, in addition to the configuration of the wireless module in accordance with the above described second or third aspect, a configuration in which: in a case where the through-hole or non-through-hole is a through-hole, a thickness of the first substrate is equal to or greater than a quarter wavelength of an effective wavelength of the RF signal in air; and in a case where the through-hole or non-through-hole is a non-through-hole, a depth of the non-through-hole is equal to or greater than the quarter wavelength.

According to the configuration, it is possible to secure a gap filled with the air within a range which is adjacent to the second signal line and has a length corresponding to the quarter wavelength. This makes it possible to inhibit a transmission loss in the second signal line.

The wireless module in accordance with a fifth aspect of the present invention includes, in addition to the configuration of the wireless module in accordance with any one of the above described second through fourth aspects, a configuration in which: the RFIC is provided in the second signal line region of the second substrate.

In the wireless module thus configured, the RFIC is accommodated in the through-hole or non-through-hole, and this makes it possible to achieve downsizing (or profile reduction) of the wireless module.

The wireless module in accordance with a sixth aspect of the present invention includes, in addition to the configuration of the wireless module in accordance with any one of the above described first through fifth aspects, a configuration in which: at least one of the conductor wall and the pseudo conductor wall is shorted to a ground layer that constitutes a signal line path together with the one or more first signal lines.

According to the wireless module thus configured, it is possible to more surely reduce an electromagnetic coupling that can occur between the first signal line and the second signal line.

[Additional Remarks]

The present invention is not limited to the embodiment and modification examples described above, but can be altered by a skilled person in the art within the scope of the claims. The present invention also encompasses in its technical scope any embodiment based on an appropriate combination of the technical means disclosed in different embodiment and modification examples.

REFERENCE SIGNS LIST 10, 10A, 10B: Wireless module
11: First substrate
111: Main surface (one surface)
112: Main surface
121 through 126: First signal line
13: Post wall (pseudo conductor wall)
13A: Conductor wall
16: Baseband IC
R': Region
17: Through-hole
17B: Non-through-hole
171: Side wall
19: Ground layer
21: Second substrate
211: Main surface (main surface on the first substrate side)
22: Second signal line group
2201, 2216, 2217, 2232: Second signal line
26: Antenna element group (one or more antenna elements)
28: RFIC
R: Second signal line region

The invention claimed is:

1. A wireless module, comprising:
an RFIC which processes an RF signal;
a baseband IC which processes a baseband signal;
a first substrate which is provided with the baseband IC on at least one main surface, the first substrate being provided with one or more first signal lines for transmitting the baseband signal;
a second substrate which is mounted so as to face one main surface of the first substrate, the RFIC being mounted on a main surface of the second substrate on a first substrate side thereof, and one or more second signal lines for transmitting the RF signal being provided on the main surface of the second substrate on the first substrate side; and
one or more antenna elements which are provided on the second substrate and are supplied with electric power through the one or more second signal lines, wherein
the first substrate is provided with at least one of a conductor wall and a pseudo conductor wall for shielding the one or more first signal lines and the one or more second signal lines.

2. The wireless module as set forth in claim 1, wherein:
the main surface of the second substrate on the first substrate side has a second signal line region which encompasses the one or more second signal lines;
a through-hole or non-through-hole corresponding to the second signal line region being provided in a region of the one main surface of the first substrate, the region facing the second signal line region; and
at least one of the conductor wall and the pseudo conductor wall is provided along at least part of a side wall of the through-hole or non-through-hole.

3. The wireless module as set forth in claim 2, wherein:
at least one of the conductor wall and the pseudo conductor wall is provided along a whole of the side wall of the through-hole or non-through-hole.

4. The wireless module as set forth in claim 2, wherein:
in a case where the through-hole or non-through-hole is a through-hole, a thickness of the first substrate is equal to or greater than a quarter wavelength of an effective wavelength of the RF signal in air; and
in a case where the through-hole or non-through-hole is a non-through-hole, a depth of the non-through-hole is equal to or greater than the quarter wavelength.

5. The wireless module as set forth in claim 2, wherein the RFIC is provided in the second signal line region of the second substrate.

* * * * *